United States Patent
Mori

(10) Patent No.: US 9,608,622 B2
(45) Date of Patent: Mar. 28, 2017

(54) DRIVE DEVICE FOR INSULATED-GATE SEMICONDUCTOR ELEMENT, AND POWER CONVERTER

(71) Applicant: FUJI ELECTRIC CO., LTD., Kawasaki-shi (JP)

(72) Inventor: Takahiro Mori, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 58 days.

(21) Appl. No.: 14/854,006

(22) Filed: Sep. 14, 2015

(65) Prior Publication Data

US 2016/0006429 A1 Jan. 7, 2016

Related U.S. Application Data

(63) Continuation of application No. PCT/JP2014/064482, filed on May 30, 2014.

(30) Foreign Application Priority Data

Jul. 3, 2013 (JP) ................. 2013-139828

(51) Int. Cl.
| | |
|---|---|
| H03K 3/00 | (2006.01) |
| H03K 17/567 | (2006.01) |
| H02M 1/088 | (2006.01) |
| H03K 17/12 | (2006.01) |
| H03K 17/14 | (2006.01) |
| H03K 17/687 | (2006.01) |

(52) U.S. Cl.
CPC .......... *H03K 17/567* (2013.01); *H02M 1/088* (2013.01); *H03K 17/127* (2013.01); *H03K 17/14* (2013.01); *H03K 17/687* (2013.01)

(58) Field of Classification Search
None
See application file for complete search history.

(56) References Cited

U.S. PATENT DOCUMENTS

| | | |
|---|---|---|
| 7,579,900 B2 | 8/2009 | Durbaum |
| 2007/0004055 A1 | 1/2007 | Ball et al. |
| 2008/0094111 A1 | 4/2008 | Nakamori et al. |
| 2011/0317315 A1* | 12/2011 | Motohashi ............. H02H 7/122 361/18 |

(Continued)

FOREIGN PATENT DOCUMENTS

| | | |
|---|---|---|
| EP | 1292027 A1 | 3/2003 |
| JP | H08-186976 A | 7/1996 |

(Continued)

*Primary Examiner* — Cassandra Cox
(74) *Attorney, Agent, or Firm* — Rabin & Berdo, P.C.

(57) ABSTRACT

A driver circuit for turning ON and OFF one of two parallel-connected insulated-gate semiconductor elements includes a voltage control circuit that controls a level of a power supply voltage in response to a detected element temperature of the one semiconductor element, a constant current supply section, responsive to a drive signal, for supplying a constant current to a gate of the one semiconductor element to turn the one semiconductor element ON, the power supply voltage being supplied to the constant current supply section from the voltage control circuit, and a discharge circuit, responsive to the drive signal, for discharging an electric charge accumulated in the gate to turn the one semiconductor element OFF.

14 Claims, 5 Drawing Sheets

(56) References Cited

U.S. PATENT DOCUMENTS

| | | | |
|---|---|---|---|
| 2013/0106470 A1* | 5/2013 | Takagiwa | H03K 17/168 327/109 |
| 2013/0153897 A1 | 6/2013 | Scilla | |
| 2013/0154579 A1* | 6/2013 | Morita | H02J 7/00 320/166 |
| 2015/0180453 A1* | 6/2015 | Mori | H02M 1/088 327/109 |
| 2015/0358013 A1* | 12/2015 | Sakai | H03K 17/0828 327/109 |

FOREIGN PATENT DOCUMENTS

| | | |
|---|---|---|
| JP | H10-42548 A | 2/1998 |
| JP | 11-235015 A | 8/1999 |
| JP | 2002-142445 A | 5/2002 |
| JP | 2002-142492 A | 5/2002 |
| JP | 2002-369497 A | 12/2002 |
| JP | 2008-103895 A | 5/2008 |
| JP | 2008-178248 A | 7/2008 |
| JP | 2009-135626 A | 6/2009 |
| JP | 2009-159662 A | 7/2009 |
| WO | WO-01/89090 A1 | 11/2001 |
| WO | WO 2005-015741 A2 | 2/2005 |
| WO | WO-2014-069146 A1 | 5/2014 |

\* cited by examiner

DRIVE DEVICE FOR INSULATED-GATE SEMICONDUCTOR ELEMENT, AND POWER CONVERTER

CROSS-REFERENCE TO RELATED APPLICATION

This is a continuation application of International Application number PCT/JP2014/064482, which was filed on May 30, 2014 and designated the United States. Furthermore, this application claims the benefit of foreign priority of Japanese application number 2013-139828, filed on Jul. 3, 2013. The disclosures of both of these earlier applications are incorporated herein by reference.

BACKGROUND OF THE INVENTION

Technical Field

The present invention relates to a drive device for an insulated-gate semiconductor element and a power converter, and particularly to a drive device for an insulated-gate semiconductor element, which is capable of driving in parallel a plurality of parallel-connected insulated-gate semiconductor elements evenly with a constant current, and a power converter.

Background Art

A power converter uses IGBTs (Insulated-Gate Bipolar Transistors) for power control, MOS-FETs (Metal-Oxide-Semiconductor Field-Effect Transistors) or other insulated-gate semiconductor elements as the semiconductor elements for controlling the load. Especially in a power converter for a high power load, generally a plurality of insulated-gate semiconductor elements are connected in parallel and driven in parallel.

FIG. 4 is a diagram showing a schematic configuration example of a power converter in which drive devices for a plurality of insulated-gate semiconductor elements are disposed in parallel.

According to this configuration example, a power converter 1 has a plurality of IGBTs 2a to 2n and a plurality of drive devices 3a to 3n for driving the IGBTs 2a to 2n respectively. The plurality of IGBTs 2a to 2n are disposed in parallel by connecting the collectors thereof to one another and connecting the emitters of the same to one another, wherein the gates of these IGBTs are connected to the outputs of the drive devices 3a to 3n, respectively. The collectors of these IGBTs 2a to 2n that are connected to one another are connected to a high power load 4, and the emitters of the same that are connected to one another are connected to a ground line GND.

The plurality of drive devices 3a to 3n receive a common drive signal and drives the IGBTs 2a to 2n in parallel, respectively. This causes the plurality of IGBTs 2a to 2n to function as a single power switching device that drives the high power load 4.

Here, the drive devices 3a to 3n control the IGBTs 2a to 2n by applying a predetermined voltage to the gates of the IGBTs 2a to 2n. On the other hand, there has been proposed a technique for lowering the possibilities of loss and noise that occur in the IGBTs 2a to 2n when the IGBTs 2a to 2n are turned ON, by supplying a constant current to the gates of the IGBTs 2a to 2n to turn the IGBTs 2a to 2n ON (see Japanese Patent Application Publication No. 2008-103895, for example).

FIG. 5 is a diagram showing a schematic configuration of a drive device for an insulated-gate semiconductor element in a system where the gates of conventional IGBTs are supplied with a constant current. Note that the plurality of drive devices 3a to 3n of the power converter 1 shown in FIG. 4 are configured in the same way; thus, FIG. 5 shows the configuration of the drive device 3a as a representative example.

The drive device 3a has a constant current circuit 5 for generating a constant current, a discharge circuit 6 for connecting the gate of the IGBT 2a to the ground, and a switching circuit 7 for complementarily turning the constant current circuit 5 and the discharge circuit 6 ON and OFF in response to a drive signal.

In the drive device 3a with the foregoing configuration, when a drive signal for turning the IGBT 2a ON is input, the switching circuit 7 turns the IGBT 2a ON by supplying the gate of the IGBT 2a with a constant current generated by the constant current circuit 5. On the other hand, when a drive signal for turning the IGBT 2a OFF is input, the switching circuit 7 activates the discharge circuit 6 to cause the discharge circuit 6 to connect the gate of the IGBT 2a to the ground and discharge the electric charge accumulated in the gate, thereby turning the IGBT 2a OFF.

In the drive device 3a with the foregoing configuration, supplying a constant current to the gate of the IGBT 2a turns the IGBT 2a ON, achieving a constant speed for charging the electric charge accumulated in the gate of the IGBT 2a. Therefore, unlike the conventional, typical drive method for turning an IGBT ON/OFF by controlling the gate voltage of the IGBT, the charging speed of the gate of an IGBT is not changed by a change in ON-resistance that depends on the temperature of a semiconductor element (transistor) that drives the gate of the IGBT. Therefore, the IGBT 2a can be turned ON at constant time regardless of a change in the temperature, lowering the possibilities of loss and noise that occur in the IGBT when the IGBT is turned ON.

Unfortunately, supplying a constant current to each of the plurality of parallel-connected IGBTs 2a to 2n to turn the IGBTs 2a to 2n ON raises the possibility that the current flows intensively to an IGBT of low gate threshold voltage due to variations in the gate threshold voltages caused by the individual difference among the IGBTs 2a to 2n. Such concentration of current at the time of turning the IGBTs ON has a risk of thermally breaking the IGBTs.

There has conventionally been proposed a technique for measuring and storing the gate current values of the plurality of IGBTs 2a to 2n in advance and controlling the gate currents of the IGBTs 2a to 2n based on these gate current values to achieve a current balance (see Japanese Patent Application Publication No. H11-235015, for example).

There has also been proposed a technique for offsetting the drive control voltages and emitter voltages of the IGBTs 2a to 2n with an equal potential in response to the difference between a target gate threshold voltage and each of the gate threshold voltages of the IGBTs 2a to 2n (see Japanese Patent Application Publication No. 2008-178248, for example). This technique can match the timings for turning the IGBTs 2a to 2n ON, achieving a current balance among the plurality of IGBTs 2a to 2n.

There has also been proposed a technique for detecting a low-temperature element and a high-temperature element and supplying the high-temperature element with a drive signal with larger delay to interfere with the flow of the current therein, while supplying the low-temperature element with a drive signal with a smaller delay to allow the current to flow easily therein (see Japanese Patent Application Publication No. 2009-159662, for example).

There has also been proposed a technique for detecting a low-temperature element and a high-temperature element, supplying the low-temperature element with a delayed drive signal, increasing the switching loss that arises when turning the element OFF to increase the amount of heat generated, and thereby equalizing the temperature and current between the low-temperature element and the high-temperature element (see Japanese Patent Application Publication No. 2009-135626, for example).

There has also been proposed a technique for comparing the temperatures between two parallel-connected power MOS-FETs and lowering the gate voltage of the power MOS-FET of a higher temperature, to equalize the temperatures of the power MOS-FETs (see Japanese Patent Application Publication No. 2002-142492, for example).

SUMMARY OF THE INVENTION

The techniques disclosed in Japanese Patent Application Publication No. H11-235015 and No. 2008-178248, however, are required to obtain the gate current values or gate threshold voltages of the plurality of IGBTs in advance. Moreover, these techniques need not only to control the gate currents of the IGBTs individually in accordance with the characteristic data of the IGBTs that are obtained beforehand, but also to perform offset control on the drive control voltages and emitter voltages of the IGBTs, and these tasks are time-consuming and lead to a complicated configuration.

On the other hand, the techniques disclosed in Japanese Patent Application Publication No. 2009-159662, No. 2009-135626 and No. 2002-142492 are configured to achieve a temperature balance between two parallel-connected semiconductor elements by comparing the temperatures thereof, which means that these techniques cannot be utilized when there exist three or more semiconductor elements connected in parallel. In addition, one of the two semiconductor elements is operated by the temperature of the other semiconductor element, leading to the potential of causing a hunting operation. Moreover, according to the device described in Japanese Patent Application Publication No. 2002-142492, because the changes in gate voltage are made constant, the temperatures of the two semiconductor elements need to be lowered alternately and repeatedly until the temperatures of the two semiconductor elements become even, resulting in a deterioration in the responsiveness thereof.

The present invention was contrived in view of these circumstances, and an object thereof is to provide a drive device for an insulated-gate semiconductor element, which is simply configured to be able to drive a plurality of parallel-connected insulated-gate semiconductor elements evenly in parallel with a constant current in a balanced manner, and to provide a power converter.

In order to solve the foregoing problems, the present invention provides a drive device for driving one of a plurality of parallel-connected insulated-gate semiconductor elements. This drive device for an insulated-gate semiconductor element has a constant current circuit that supplies a constant current to a gate of the insulated-gate semiconductor element when the insulated-gate semiconductor element is turned ON, to drive the insulated-gate semiconductor element with the constant current. The drive device also has a discharge circuit that discharges an electric charge accumulated in the gate when the insulated-gate semiconductor element is turned OFF, and a switching circuit that receives an input of a drive signal and switches between the execution of constant current drive on the insulated-gate semiconductor element using the constant current circuit and the execution of discharge of the electric charge using the discharge circuit. The drive device of the present invention further has a voltage control circuit that variably controls a power supply voltage of the constant current circuit in response to a temperature that is detected by a temperature detecting element contained in the insulated-gate semiconductor element. In other words, this drive device equalizes the currents flowing in the plurality of insulated-gate semiconductor elements by executing the combination of the constant current drive and the drive voltage control on the insulated-gate semiconductor elements.

The present invention also provides a power converter that has a plurality of parallel-connected insulated-gate semiconductor elements and a plurality of drive devices for driving the insulated-gate semiconductor elements, respectively. The drive devices each have a constant current circuit that supplies a constant current to gates of the insulated-gate semiconductor elements when the insulated-gate semiconductor elements are turned ON. Also, the drive devices each have a discharge circuit that discharges an electric charge accumulated in each of the gates of the insulated-gate semiconductor elements when the insulated-gate semiconductor elements are turned OFF, and a switching circuit that receives an input of a drive signal and switches between the execution of constant current drive on each of the insulated-gate semiconductor elements using the constant current circuit and the execution of discharge of the electric charge using the discharge circuit. Moreover, the drive devices of the present invention each have a voltage control circuit that variably controls a power supply voltage of the constant current circuit in response to the difference between a reference voltage and a detection voltage corresponding to a temperature that is detected by a temperature detecting element contained in each of the insulated-gate semiconductor elements. In other words, in this power converter, the drive devices each equalize the currents flowing in the plurality of insulated-gate semiconductor elements by executing the combination of the constant current drive and the drive voltage control on the insulated-gate semiconductor elements.

The drive device and the power converter for and insulated-gate semiconductor element that are configured as described above regulate the magnitudes of the drive voltages for turning the insulated-gate semiconductor elements ON, in response to the temperature detected by the temperature detecting element. Therefore, regardless of variations in the gate threshold voltages caused by the individual difference among the plurality of insulated-gate semiconductor elements, the timings for turning the insulated-gate semiconductor elements ON can be matched.

Additionally, by supplying a constant current to the gate of each insulated-gate semiconductor element, each of the insulated-gate semiconductor elements can be turned ON without being affected by a change in ON-resistance of a semiconductor element (transistor) that drives the gate of each temperature-dependent insulated-gate semiconductor element, resulting in lowering losses and noise that occur when turning the insulated-gate semiconductor elements ON.

Therefore, based on such a simple configuration of regulating the magnitudes of the drive voltages supplied to the gates of the insulated-gate semiconductor elements in response to the voltages generated from the temperature detecting elements contained in the insulated-gate semiconductor elements, the present invention can bring about a great deal of benefits such as securing a current balance among the plurality of insulated-gate semiconductor elements and preventing thermal breakdown of the insulated-gate semiconductor elements caused by concentration of currents.

The foregoing and other objects, features and advantages of the present invention will become more apparent from the following description associated with the accompanying drawings illustrating preferred embodiments of the present invention.

DETAILED DESCRIPTION OF THE INVENTION

Examples of using IGBTs as insulated-gate semiconductor elements are described hereinafter in detail as the embodiments of the present invention with reference to the drawings.

Figure 1:
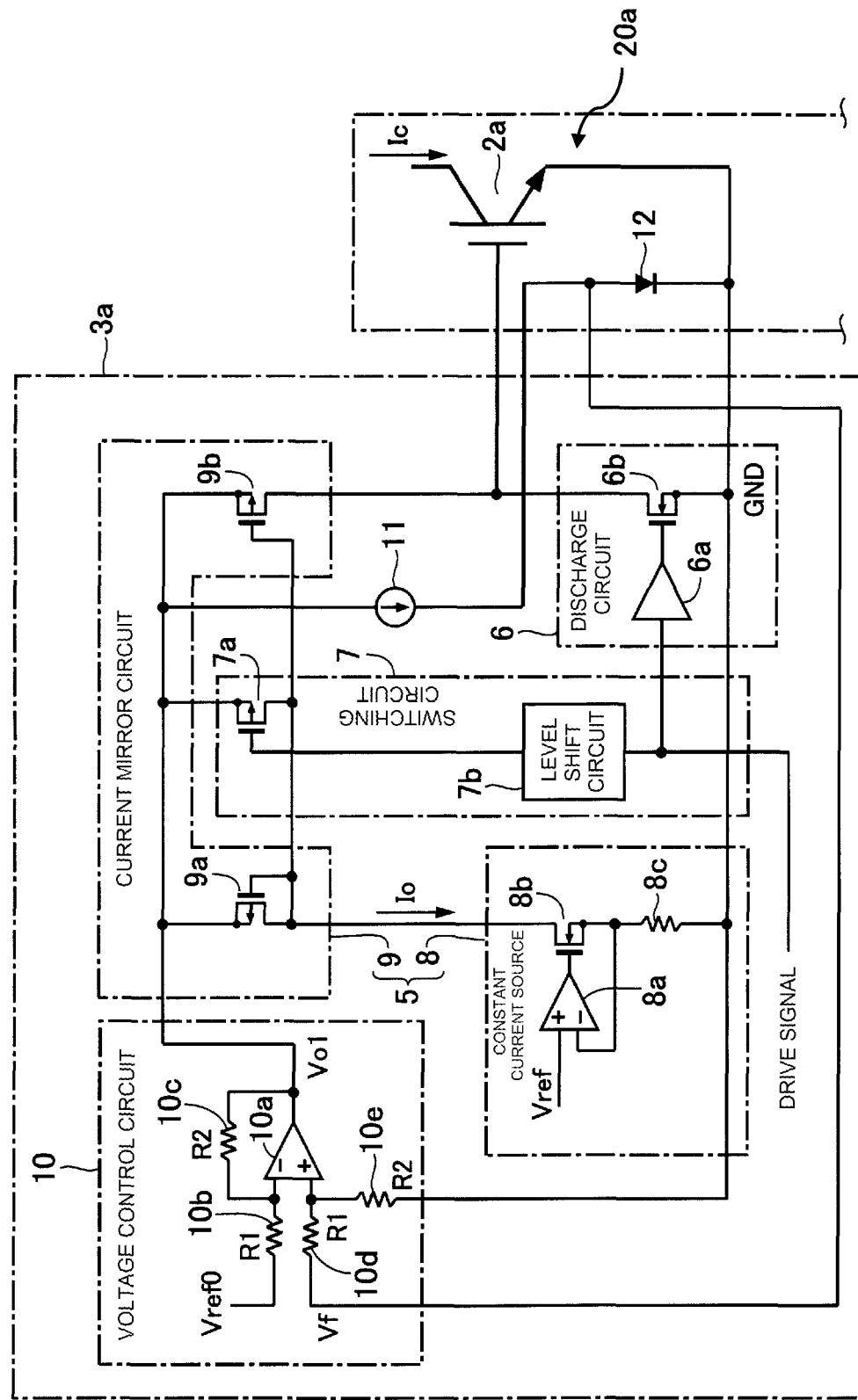
FIG. 1 is a diagram of a schematic configuration example showing substantial parts of a drive device for an insulated-gate semiconductor element according to a first embodiment.
Figure 2:
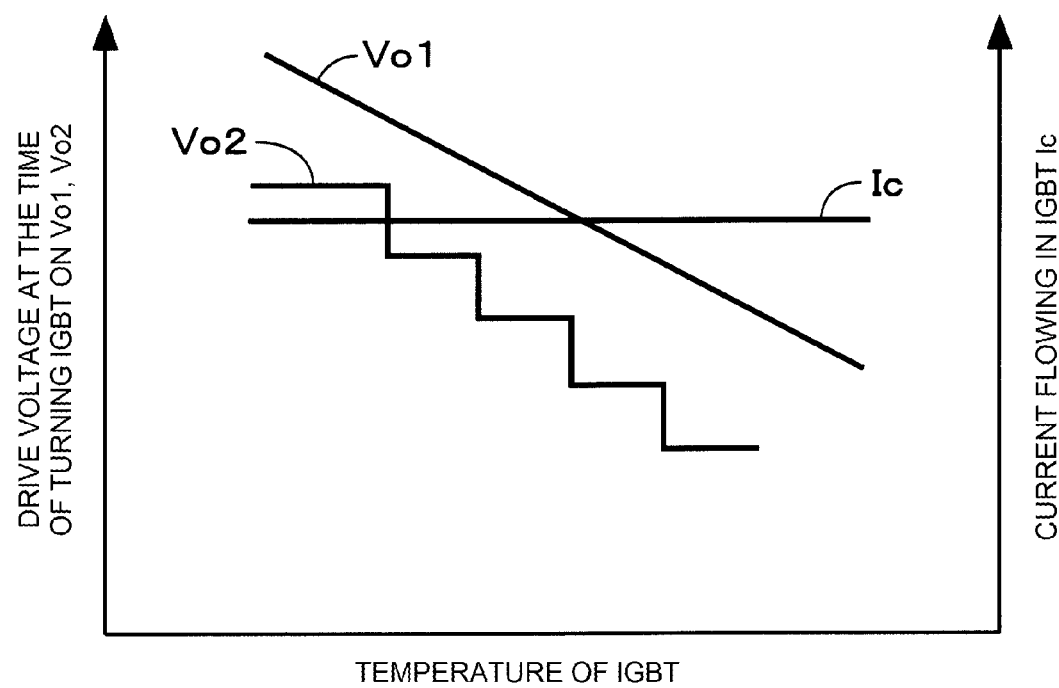
FIG. 2 is a diagram showing turn-on drive voltage characteristics of the insulated-gate semiconductor element.
Figure 4:
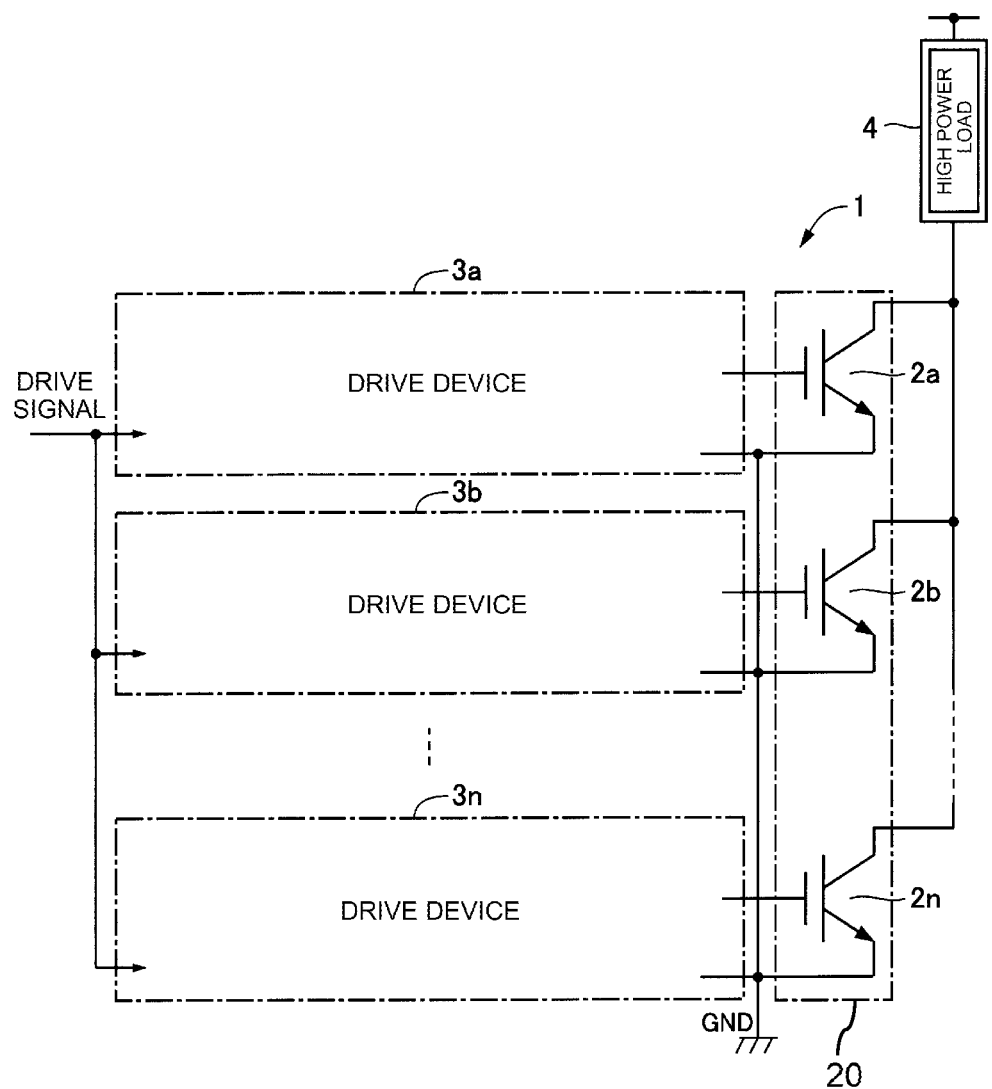
FIG. 4 is a diagram of a schematic configuration example showing a power converter in which drive devices for a plurality of insulated-gate semiconductor elements are arranged in parallel.
Figure 5:
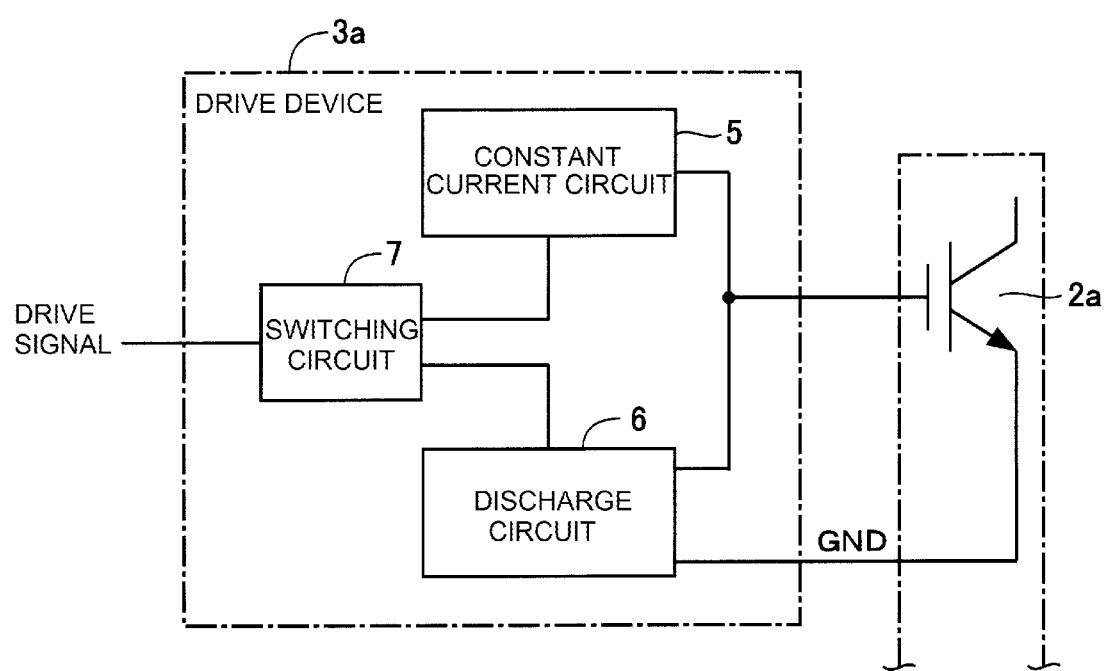
FIG. 5 is a diagram showing a schematic configuration of a drive device for an insulated-gate semiconductor element based on a system for supplying a constant current to a gate of a conventional IGBT.

FIG. 1 is a diagram of a schematic configuration example showing substantial parts of a drive device (driver circuit) for an insulated-gate semiconductor element according to a first embodiment. FIG. 2 is a diagram showing turn-on drive voltage characteristics of the insulated-gate semiconductor element. Note that FIG. 1 shows a schematic configuration of a drive device 3a as a representative example, one of drive devices 3a to 3n that drive a plurality of IGBTs 2a to 2n (parallel-connected insulated-gate semiconductor elements 20) shown in FIG. 4, wherein the other drive devices 3b to 3n have the same configuration as the drive device 3a. The same reference numerals are used to describe the components same as those configuring the drive device 3a shown in FIG. 5.

The drive device 3a has a constant current source 8 and a current mirror circuit 9. The constant current source 8 and the current mirror circuit 9 configure a constant current circuit 5 shown in FIG. 5. The drive device 3a also has a discharge circuit 6, a switching circuit 7, a voltage control circuit 10, and a constant current circuit 11. The constant current source 8, the current mirror circuit 9, and the switching circuit 7 configure a constant current supply section. The IGBT 2a and a temperature detecting diode 12 for detecting heat generated by the IGBT 2a as a temperature detecting element configure a parallel-connected insulated-gate semiconductor element 20a.

The constant current source 8 has an operational amplifier 8a, an n-channel FET (abbreviated as "n-FET," hereinafter) 8b, and a resistor 8c. A reference voltage Vref is supplied to the non-inverted input terminal (+) of the operational amplifier 8a, and the output terminal of the operational amplifier 8a is connected to the gate of the n-FET 8b. The source of the n-FET 8b is connected to the inverted input terminal (−) of the operational amplifier 8a and is also connected to a ground line GND by the resistor 8c.

In the constant current source 8, the two input terminals of the operational amplifier 8a virtually short-circuit, whereby the reference voltage Vref is applied to the resistor 8c that is interposed between the source of the n-FET 8b and the ground line. Therefore, an output current $I_O$ of the constant current source 8 (i.e., drain current of the n-FET 8b) is fixed by a formula, $I_O = Vref/Rref$, where Rref represents the value of the resistor 8c.

The current mirror circuit 9 has a pair of p-channel FETs (abbreviated as "p-FETs," hereinafter) 9a, 9b. The p-FET 9a has its source connected to a power supply line and has its drain connected to its gate and to the output of the constant current source 8 (i.e., the drain of the n-FET 8b). The p-FET 9b, on the other hand, has its source connected to the power supply line, its drain connected to the gate of the IGBT 2a, and its gate to the drain and gate of the p-FET 9a.

In this current mirror circuit 9, when the p-FET 9a is driven by the constant current Io output by the constant current source 8, the p-FET 9b outputs a constant current $[k \times I_O$ (k is a constant)] proportional to the constant current $I_O$. As a result, the current mirror circuit 9 supplies the constant current $[k \times I_O]$ proportional to the current Io to the gate of the IGBT 2a.

The discharge circuit 6 has a buffer circuit 6a and an n-FET 6b. A drive signal is input to the input terminal of the buffer circuit 6a, and the gate of the n-FET 6b is connected to the output terminal of the buffer circuit 6a. The n-FET 6b has its drain connected to the gate of the IGBT 2a and its source connected to the ground line GND.

In this discharge circuit 6, when the drive signal input to the buffer circuit 6a is [H level], the buffer circuit 6a turns the n-FET 6b ON and discharges an electric charge accumulated in the gate of the IGBT 2a to the ground line GND, thereby turning the IGBT 2a OFF.

The switching circuit 7 has a p-FET 7a and a level shift circuit 7b. The p-FET 7a has its source connected to the power supply line and its drain connected to the gate of the p-FET 9b of the current mirror circuit 9. A drive signal is input to the input of the level shift circuit 7b, and the gate of the p-FET 7a is connected to the output of the level shift circuit 7b.

In this switching circuit 7, the level shift circuit 7b shifts the level of the drive signal and controls the gate voltage of the p-FET 7a, thereby turning the p-FETs 9a, 9b of the current mirror circuit 9 ON/OFF.

In other words, in the switching circuit 7, when the drive signal is [L level], the level shift circuit 7b turns the p-FET 7a OFF and turns the current mirror circuit 9 ON. As a result, the p-FET 9b of the current mirror circuit 9 supplies the constant current $[k \times I_O]$ to the gate of the IGBT 2a. At this moment, the [L level] drive signal is supplied to the discharge circuit 6 and the n-FET 6b of the discharge circuit 6 is turned OFF, turning the IGBT 2a ON. In other words, the discharge circuit 6 is controlled so as to be turned ON/OFF by the drive signal directly input or the drive signal input through the switching circuit 7.

However, when the drive signal is [H level], the level shift circuit 7b of the switching circuit 7 turns the p-FET 7a ON. As a result, the current mirror circuit 9 is turned OFF, resulting in stopping the supply of the current from the current mirror circuit 9 to the gate of the IGBT 2a. At this moment, because the [H level] drive circuit is input, the n-FET 6b of the discharge circuit 6 is turned ON, connecting the gate of the IGBT 2a to the ground line GND and discharging the electric charge accumulated in the gate of the IGBT 2a. As a result, the IGBT 2a is turned OFF.

The parallel-connected insulated-gate semiconductor element 20a contains the IGBT 2a and the temperature detecting diode 12. The constant current circuit 11 is connected to the anode of the temperature detecting diode 12, and the cathode of the temperature detecting diode 12 is connected to the ground line GND. A constant current that is output from the constant current circuit 11 constantly flows in the temperature detecting diode 12. The temperature detecting diode 12 is also configured to output, as a diode voltage Vf, a forward voltage that is changed by the temperature of the IGBT 2a. Note that the temperature characteristics of the forward voltage of the temperature detecting diode 12 are, for example, approximately −2.0 to −2.5 mV/° C.

The voltage control circuit 10 has an operational amplifier 10a and four resistors 10b, 10c, 10d, 10e and configures a differential amplifier circuit. In other words, the operational amplifier 10a is configured to receive a reference voltage Vref0 at its inverted input terminal (−) through the resistor 10b and is connected to its own output by the resistor 10c. The reference voltage Vref0 defines a drive voltage Vo1 for the constant current source 8 and the current mirror circuit 9 and is set beforehand. The non-inverted input terminal (+) of the operational amplifier 10a is configured to receive the input of the diode voltage Vf of the temperature detecting diode 12 through the resistor 10d and is connected to the ground line GND by the resistor 10e.

The voltage control circuit 10 is configured to amplify the voltage difference ΔV between the diode voltage Vf and the reference voltage Vref0 and output the drive voltage Vo1 for the constant current source 8 and the current mirror circuit 9.

Specifically, the drive voltage Vo1 that is output by the voltage control circuit 10 is defined as follows:

$$Vo1=(R2/R1)\times(Vf-Vref0)$$

where R1 represents the value of each of the resistors 10b, 10d, which are the input resistors of the operational amplifier 10a, and R2 represents each of the values of the feedback resistor 10c and the grounding resistor 10e. In other words, the temperature detecting diode 12 detects the heat generated in the IGBT 2a and outputs the diode voltage Vf, and the voltage control circuit 10 performs feedback control on the drive voltage Vo1 for the constant current source 8 and the current mirror circuit 9 in response to the diode voltage Vf. Specifically, the following feedback is performed: the temperature of the IGBT 2a rises (drops)→the diode voltage Vf becomes low (high)→the drive voltage Vo1 becomes low (high)→the gate voltage of the IGBT 2a becomes low (high) because the final gate voltage when the IGBT 2a is ON is determined based on the drive voltage Vo1→the current flowing to the IGBT 2a becomes low (high).

In other words, the magnitude of the drive voltage Vo1 that drives the gate of the IGBT 2a can be controlled by controlling the drive voltage Vo1 for the constant current source 8 and the current mirror circuit 9 in response to variations in the gate threshold voltage that are caused by the individual difference among IGBTs 2a, or in response to the generated temperature.

Particularly, because the input resistors 10b and 10d, the feedback resistor 10c, and the grounding resistor 10e that share the same temperature characteristics are used, variations in the resistance values of these resistors can be offset. In addition, in all of the drive devices 3a to 3n, the temperature characteristics of the reference voltages Vref0 and Vref are kept within ±3% of a standard value in a range of, for example, −20 to 125° C. More specifically, each predetermined reference voltage is maintained a difference from a standard value within 3% of the standard value in a range of −20 to 125° C. as its temperature characteristic. Further, the temperature characteristics of the diode voltage Vf are kept within ±10% thereof. More specifically, each temperature detecting diode 12 included in the corresponding semiconductor element 20a outputs a voltage corresponding to a temperature, and a temperature characteristic of each temperature detecting diode 12 maintains a change of a output voltage level depending on a change of the temperature within 10%. Accordingly, combined with the effect of offsetting variations in the resistance values described above, the temperature characteristics of the drive voltage Vo1 for the constant current source 8 and the current mirror circuit 9 can be made sufficiently precise in relation to changes in the temperatures of the IGBTs 2a to 2n.

As a result, in spite of the variations in the gate threshold voltages of the plurality of parallel-connected IGBTs 2a to 2n, the magnitude of the drive voltage Vo1 for driving the gate of each IGBT can be subjected to feedback control and optimized in accordance with the temperatures of the IGBTs 2a to 2n (diode voltages Vf). In other words, the feedback control is performed in such a manner that the drive voltage Vo1 drops continuously as the temperatures of the IGBTs 2a to 2n rise (the diode voltages Vf drop), thereby keeping currents Ic that flow to the IGBTs 2a to 2n constant, as shown in FIG. 2. Thus, even when the temperature of any of the IGBTs 2a to 2n is changed as a result of a change in the current flowing therein due to the variations in the gate threshold voltages, changes in the drive voltage Vo1 can keep the flowing currents Ic constant. Consequently, the current Ic that flows in each of the plurality of parallel IGBTs 2a to 2n is effectively prevented from becoming off balance, preventing concentration of current in a certain IGBT and hence thermal breakdown thereof.

In the drive device 3a according to the first embodiment as described above, the temperature of the IGBT 2a is detected by the temperature detecting diode 12 that configures the parallel-connected insulated-gate semiconductor element 20a together with the IGBT 2a, and feedback control is performed on the drive voltage Vo1 for the constant current source 8 and the current mirror circuit 9. Executing the constant current drive and drive voltage control on the IGBTs 2a to 2n converges the current Ic flowing in each of the IGBTs 2a to 2n on current values corresponding to the reference voltage Vref0 of substantially the same temperature characteristics, making the currents Ic of all the IGBTs 2a to 2n even.

Figure 3:
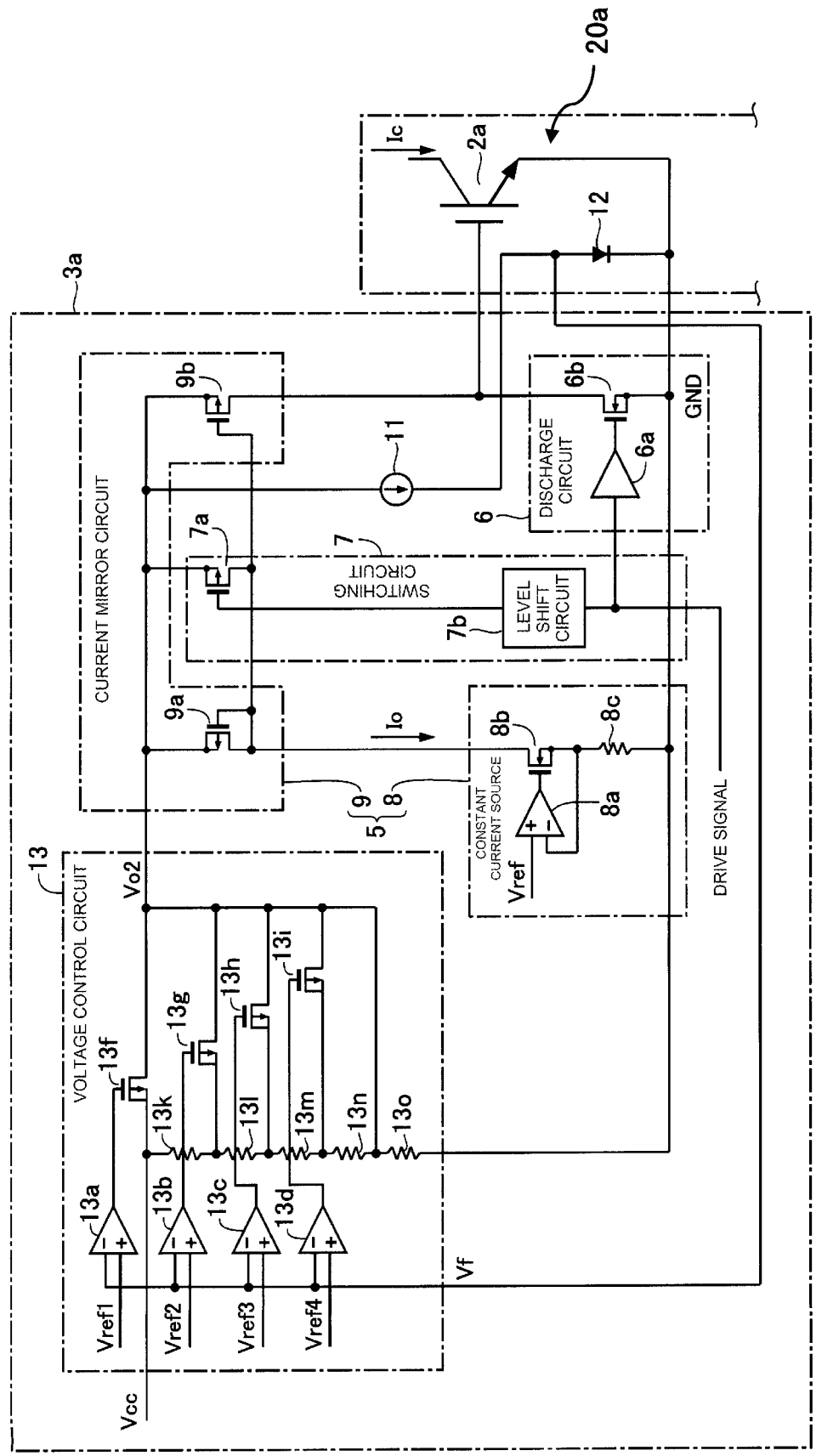
FIG. 3 is a diagram of a schematic configuration example showing substantial parts of a drive device for an insulated-gate semiconductor element according to a second embodiment.

FIG. 3 is a diagram of a schematic configuration example showing substantial parts of a drive device for an insulated-gate semiconductor element according to a second embodiment. In FIG. 3, the same reference numerals are used to describe the components same as those shown in FIG. 1, omitting the detailed descriptions thereof.

Compared to the drive device 3a according to the first embodiment, the voltage control circuit 10 of a drive device 3a for an insulated-gate semiconductor element according to the second embodiment is replaced with a voltage control circuit 13 of a different configuration.

In other words, the voltage control circuit 13 has a plurality of (four, in the example shown in FIG. 3) comparator 13a, 13b, 13c, 13d, p-FETs 13f, 13g, 13h, 13i functioning as switch elements, and resistors 13k, 13l, 13m, 13n, 13o.

The inverted input terminals (−) of the comparators 13a, 13b, 13c, 13d are configured to receive the input of the diode voltage Vf of the temperature detecting diode 12. The non-inverted input terminals (+) of the comparators 13a, 13b, 13c, 13d are configured to receive the input of a first threshold voltage Vref1, a second threshold voltage Vref2, a third threshold voltage Vref3, and a fourth threshold voltage Vref4, respectively, whose temperature characteristics are same as the reference voltages of the first embodiment. The outputs of the comparators 13a, 13b, 13c, 13d are connected to the gates of the p-FETs 13f, 13g, 13h, 13i, respectively.

The source of the p-FET 13f is connected to a power supply voltage Vcc that is supplied as a device power supply voltage and is connected to the ground line GND by the serially connected resistors 13k, 13l, 13m, 13n, 13o configuring a voltage divider circuit. The connecting point between the resistor 13k and the resistor 13l is connected to the source of the p-FET 13g. The connecting point between the resistor 13l and the resistor 13m is connected to the source of the p-FET 13h. The connecting point between the resistor 13m and the resistor 13n is connected to the source of the p-FET 13i. The drains of the p-FETs 13f, 13g, 13h, 13i are integrated to output a drive voltage Vo2 for the constant current source 8 and the current mirror circuit 9.

In the voltage control circuit 13, the comparators 13a to 13d compare the diode voltage Vf with the first to fourth threshold voltages Vref1 to Vref4, and variably set the drive voltage Vo2 for the constant current source 8 and the current mirror circuit 9 in response to the comparison results. It should be noted that normally (when the temperature of the IGBT 2a is equal to or lower than a predetermined temperature) the relationship between the diode voltage Vf and the first to fourth threshold voltages Vref1 to Vref4 is as follows.

$$Vf > Vref1 > Vref2 > Vref3 > Vref4$$

Specifically, the power supply voltage Vcc is divided into the five serially connected resistors 13k(R11), 13l(R12), 13m(R13), 13n(R14), and 13o(R15), and the divided voltages or the power supply voltage Vcc are selected in accordance with the diode voltage Vf and output as the drive voltage Vo2.

For instance, during the normal operation, because the diode voltage Vf is greater than the first threshold voltage Vref1, all the p-FETs 13f to 13i are turned ON, and the drive voltage Vo2 becomes equal to the power supply voltage Vcc. Furthermore, when the temperature of the IGBT 2a rises and the diode voltage Vf becomes lower than the first threshold voltage Vref1, the p-FET 13f is turned OFF, and the drive voltage Vo2 becomes equal to the voltages obtained by dividing the power supply voltage Vcc: Vo2=Vcc×R15/(R11+R15). At this moment, the resistors 13l(R12), 13m(R13), and 13n(R14) are shorted due to the fact that the p-FETs 13g to 13i are ON.

When the temperature of the IGBT 2a further rises and the diode voltage Vf becomes lower than the second threshold voltage Vref2, the drive voltage Vo2 becomes as follows.

$$Vo2 = Vcc \times R15/(R11+R12+R15)$$

In the drive device 3a with this voltage control circuit 13, the drive voltage Vo2 of the IGBT 2a changes in a stepwise manner (five steps, in this case) in response to the temperature of the IGBT, as shown in FIG. 2. Therefore, although the control according to the second embodiment is not as precise as that of the first embodiment, the magnitude of the drive voltage Vo2 supplied to each of the gates of the IGBTs 2a to 2n can be configured to conform to the turn-on characteristics of the IGBTs 2a to 2n as in the first embodiment. Moreover, the currents Ic that flow through the IGBTs 2a to 2n can be kept constant, effectively preventing the currents Ic that flow through the plurality of parallel-connected IGBTs 2a to 2n from becoming off balance. This, as a result, can prevent concentration of current in a certain IGBT and hence thermal breakdown thereof.

Note that the present invention is not limited to the foregoing embodiments. For instance, not only is it possible to change the configuration of the constant current source 8, but also the drive voltage Vo2 can be variably set with more or less steps in accordance with the diode voltage Vf in the drive device for an insulated-gate semiconductor element according to the second embodiment. The present invention can be applied similarly to a situation in which MOS-FETs are driven in place of the IGBTs described above. Moreover, for the purpose of alleviating the variations among the drive devices 3a to 3n, the reference voltages Vref, Vref0 and first to fourth threshold voltages Vref1 to Vref4 of the individual drive devices 3a to 3n can be shared by all the drive devices 3a to 3n. In addition, various modifications can be made to the present invention without departing from the gist thereof.

The foregoing description is merely an illustration of the principle of the present invention. A number of modifications and changes can be made by those skilled in the art. The present invention is not intended to be limited to the exact configurations and applications described and illustrated above, but is intended to cover all the relevant modifications and equivalents as the accompanying claims and equivalents thereof.

What is claimed is:

1. A driver circuit for turning ON and OFF one of two parallel-connected insulated-gate semiconductor elements, comprising:
    a voltage control circuit that controls a level of a power supply voltage in response to a detected element temperature of the one semiconductor element;
    a constant current supply section, responsive to a drive signal, for supplying a constant current to a gate of the one semiconductor element to turn the one semiconductor element ON, said power supply voltage being supplied to the constant current supply section from the voltage control circuit; and
    a discharge circuit, responsive to the drive signal, for discharging an electric charge accumulated in said gate to turn the one semiconductor element OFF.

2. The driver circuit according to claim 1, wherein the constant current supply section includes
    a constant current circuit that supplies the constant current to said gate, and
    a switching circuit that is responsible to the drive signal to start and stop supplying the constant current by the constant current circuit to said gate.

3. The driver circuit according to claim 2, wherein the constant current circuit includes
    a resistor;
    a first transistor having a source connected to a ground line through the resistor,
    an operational amplifier that compares a terminal voltage of the resistor with a reference voltage and drives a gate of the first transistor,
    a second transistor having a drain and a gate each connected to a drain of the first transistor, and having a source connected to the device power supply, and
    a third transistor having a source connected to the device power supply voltage, having a gate connected to the gate of the second transistor, and having a drain connected to the gate of the one semiconductor element.

4. The driver circuit according to claim 3, wherein the switching circuit includes
   a fourth transistor having a source connected to a power supply voltage line of the constant current circuit and having a drain connected to the gate of the second transistor, and
   a level shift circuit that shifts a level of the drive signal and supplies the level shifted drive signal to a gate of the fourth transistor.

5. The driver circuit according to claim 1, wherein the voltage control circuit includes an operational amplifier that
   receives a predetermined reference voltage and a voltage corresponding to the detected element temperature, said detected element temperature being detected by a temperature detecting element included in the one semiconductor element,
   amplifies a voltage difference between the voltage corresponding to the predetermined reference voltage and the detected element temperature to be output as a power supply voltage of the constant current supply section, and
   continuously changes the power supply voltage of the constant current supply section in response to the voltage corresponding to the detected element temperature.

6. The driver circuit according to claim 1,
wherein the voltage control circuit includes
   a plurality of comparators each of which compares a voltage corresponding to the detected element temperature with one of a plurality of predetermined reference voltages that have different voltage levels,
   a voltage divider, to which is input a device power supply voltage, and which outputs a plurality of divided voltages obtained by dividing the device power supply voltage, and
   a plurality of switch elements each of which corresponds to a respective one of the divided voltage and a corresponding one of the comparators, each switch element being connected between a power supply line of the constant current supply section and both the device power supply voltage and the corresponding divided voltage, and that is turned ON/OFF in response to a respective comparison result of the corresponding comparator, and
wherein the voltage control circuit changes the power supply voltage of the constant current supply section in a stepwise manner by selectively turning the plurality of switch elements ON/OFF in response to the voltage corresponding to the detected element temperature.

7. The driver circuit according to claim 1, wherein the discharge circuit includes
   a buffer circuit that receives said drive signal, and
   a transistor having a gate connected to an output terminal of the buffer circuit, having a source connected to a ground line, and having a drain connected to the gate of the one semiconductor element.

8. A driver circuit for turning ON and OFF one of two parallel-connected insulated-gate semiconductor elements, comprising:
   a voltage control circuit that controls a level of a power supply voltage for driving the one semiconductor element in response to a detected element temperature of said one semiconductor element, and
   a constant current supply section that supplies a constant current to a gate of said one semiconductor element to turn said one semiconductor element ON, said power supply voltage being supplied to the constant current supply section from the voltage control circuit.

9. The driver device according to claim 8, further comprising
   a discharge circuit that discharges an electric charge accumulated in the gate to turn the one semiconductor element OFF in response to a drive signal for the one semiconductor element, wherein
the constant current supply section includes
   a constant current circuit that supplies the constant current to said gate, and
   a switching circuit that is responsible to the drive signal to start and stop supplying the constant current by the constant current circuit to said gate.

10. The driver device according to claim 9, wherein
the drive signal alternates between a first level and a second level,
the switching circuit controls the constant current circuit so that the constant current is supplied to said gate when the drive signal is at the first level and is not supplied to said gate when the drive signal is at the second level, and
the discharge circuit discharges the electric charge when the drive signal is at the second level.

11. The driver device according to claim 8, wherein
the driver circuit turns on and off the one semiconductor element including a temperature detecting element that detects the detected element temperature, and
the voltage control circuit includes an operational amplifier that
   receives a predetermined reference voltage and a voltage corresponding to the detected element temperature,
   amplifies a voltage difference between the predetermined reference voltage and the voltage corresponding to the detected element temperature to be output as a power supply voltage of the constant current supply section, and
continuously changes the power supply voltage of the constant current supply section in response to said voltage corresponding to the detected element temperature.

12. A power converter comprising:
a plurality of parallel-connected insulated-gate semiconductor elements; and
a plurality of driver circuits each for driving a different corresponding one of the semiconductor elements, respectively,
wherein the plurality of driver circuits each includes
   a voltage control circuit that controls a level of a power supply voltage in response to a detected element temperature of the corresponding semiconductor element;
   a constant current supply section, responsive to a drive signal, for supplying a constant current to a gate of the corresponding semiconductor element to turn the corresponding semiconductor element ON, said power supply voltage being supplied to the constant current supply section from the voltage control circuit; and
   a discharge circuit, responsive to the drive signal, for discharging an electric charge accumulated in said gate to turn the corresponding semiconductor element.

13. The power converter according to claim 12, wherein each voltage control circuit controls the level of the power supply voltage in response to a difference between a predetermined reference voltage and a voltage corresponding to the detected element temperature of the corresponding semiconductor element, said detected element temperature being detected by a temperature detecting element included in the corresponding semiconductor element.

14. The power converter according to claim 13, wherein
a temperature characteristic of each predetermined reference voltage maintains a level difference between the each predetermined reference and a standard value no more than 3% of said standard value in a temperature range of −20 to 125° C., and
the temperature detecting element included in each semiconductor element outputs a voltage corresponding to the detected element temperature, a temperature characteristic of each temperature detecting element maintaining a change of an output voltage level of thereof depending on a change of the detected element temperature within 10%.

* * * * *